United States Patent
Nunan et al.

(10) Patent No.: US 8,507,913 B2
(45) Date of Patent: Aug. 13, 2013

(54) METHOD OF BONDING WAFERS (75) Inventors: Thomas Kieran Nunan, Carlisle, MA (US); Changhan Yun, San Diego, CA (US); Christine H. Tsau, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 316 days.

(21) Appl. No.: 12/893,587

(22) Filed: Sep. 29, 2010

(65) Prior Publication Data

US 2012/0074417 A1    Mar. 29, 2012

(51) Int. Cl.
*H01L 31/00* (2006.01)

(52) U.S. Cl.
USPC    257/62; 257/616; 257/E21.122; 257/E23.179; 438/406; 438/455

(58) Field of Classification Search
None
See application file for complete search history.

(56) References Cited

U.S. PATENT DOCUMENTS

| 3,461,462 | A | 8/1969 | Ruggiero | |
| 5,693,574 | A | 12/1997 | Schuster et al. | 437/225 |
| 7,442,570 | B2 | 10/2008 | Nasiri et al. | 438/48 |
| 7,677,099 | B2 | 3/2010 | Nasiri et al. | 73/504.12 |
| 2005/0161836 | A1* | 7/2005 | Yudasaka et al. | 257/797 |
| 2006/0208326 | A1 | 9/2006 | Nasiri et al. | 257/414 |

FOREIGN PATENT DOCUMENTS

| WO | WO 2002/42716 | A2 | 5/2002 |
| WO | WO 2009/049958 | | 4/2009 |
| WO | WO 2009/049958 | A2 | 4/2009 |
| WO | WO 2009/049958 | A3 | 4/2009 |

OTHER PUBLICATIONS

IDS Reference AK: Vu et al., "Patterned eutectic bonding with Al/Ge thin films for microelectromechanical systems", J. Vac. Sci. Technol. B 14, 2588 (1996); doi: 10.1116/1.588991, http://dx.doi.org/10.1116/1.588991.*
Zavracky, P., et al., "Patterned Eutectic Bonding with Al/Ge Thin Films for MEMS," SPIE, vol. 2639, pp. 46-52, Oct. 23, 1995.
Vu, B., et al., "Patterned Eutectic Bonding with Al/Ge Thin Films for Microelectromechanical Systems," *J. Vac. Sci. Technol. B.*, 14(4) Jul./Aug. 1996, pp. 2588-2594.

* cited by examiner

*Primary Examiner* — Tan N Tran
*Assistant Examiner* — Scott R Wilson
(74) *Attorney, Agent, or Firm* — Sunstein Kann Murphy & Timbers LLP (57) ABSTRACT

A method of bonding wafers with an aluminum-germanium bond includes forming an aluminum layer on a first wafer, and a germanium layer on a second wafer, and implanting the germanium layer with non-germanium atoms prior to forming a eutectic bond at the aluminum-germanium interface. The wafers are aligned to a desired orientation and the two layers are held in contact with one another. The aluminum-germanium interface is heated to a temperature that allows the interface of the layers to melt, thus forming a bond. A portions of the germanium layer may be removed from the second wafer to allow infrared radiation to pass through the second wafer to facilitate wafer alignment.

20 Claims, 9 Drawing Sheets

METHOD OF BONDING WAFERS

TECHNICAL FIELD

The present invention relates methods of bonding wafers, and more particularly to bonding wafers using an aluminum to germanium bond.

BACKGROUND ART

It is known in the prior art to bond wafers using an intermediate material, such as a glass frit, or a metal-to-metal bond. Bonding with a glass frit requires a large bond footprint, which increases the area and cost of the bond. Bonding with a glass frit may also introduce contaminants into a cavity between the bonded wafer, which may degrade the performance of the wafers being bonded or any devices fabricated in or on a wafer.

Metal-to-metal bonding using aluminum and sputtered germanium has been constrained by the need for a dedicated tool or chamber, which adds cost and complexity to the bonding process. Some bonds require that the aluminum layer be considerably thicker than the germanium layer, and that the germanium layer is formed near the end of the fabrication process, which constraints add cost and complexity to the process.

SUMMARY OF ILLUSTRATIVE EMBODIMENTS

A wafer is prepared for use by depositing a germanium layer on the wafer, and then creating an amorphous region within the germanium layer. If the wafer is a germanium wafer, then an amorphous region may be fabricated into the surface of the wafer.

Illustrative embodiments create an amorphous region by ion bombardment. An ion implanter implants ions into the single-crystal germanium layer to create an amorphous region extending into the germanium layer, where the crystal structure of the germanium is disrupted or damaged. The ions may be antimony ions, arsenic ions, or argon ions, for example.

Various embodiments facilitate wafer bonding using a eutectic germanium-aluminum bond by preparing the germanium layer prior to bonding. The germanium layer (which may also be known as a Ge layer) with an amorphous region may be part of a capping wafer useful for wafer capping operations, and may include patterned germanium cap structures, and the wafer may further include trenches between the cap structures.

In some embodiments, a second wafer has an aluminum layer (which may also be known as an Al layer or aluminium layer). The aluminum layer may comprise a plurality of aluminum walls surrounding features on the second wafer, and the walls may correspond to germanium regions on the first wafer. The two wafers may be held together and aligned such that the germanium layer and aluminum layer contact one another. The wafers may be heated so that a eutectic germanium-aluminum bond is formed at or about the eutectic temperature of an aluminum and germanium alloy. The aluminum layer may be patterned to surround devices on an integrated circuit ("IC") wafer or MEMS devices on a MEMS wafer. The germanium layer may be a continuous covering on the surface of a cap wafer, or may be patterned to match the patterns on the opposing IC wafer or MEMS wafer. The resulting germanium-aluminum bond may be hermetic.

Some embodiments include an alignment structure on the IC wafer or MEMS wafer. The alignment structure may be useful in aligning the wafers prior to bonding or post-bonding alignment verification. There are many ways known in the art to align wafers, and some involve the use of an alignment structure. For example, an infrared source may illuminate the infrared structure on an IC wafer or MEMS wafer through a cap wafer. An alignment window may be formed in the germanium layer to permit the passage if infrared radiation, and the shape of the alignment window may interact with the shape of the alignment structure to provide information regarding the alignment.

BRIEF DESCRIPTION OF THE DRAWINGS

The foregoing features of the invention will be more readily understood by reference to the following detailed description, taken with reference to the accompanying drawings, in which.

DETAILED DESCRIPTION OF ILLUSTRATIVE EMBODIMENTS

Various embodiments permit a user to readily form a germanium-aluminum bond. Such a bond may be used in wafer bonding, for example, such as in a wafer capping application. The germanium-aluminum bond may be eutectic, and may be hermetic.

To that end, various embodiments employ a doped germanium layer that includes an amorphous region. When the germanium layer is bonded to an aluminum region, the amorphous region at the surface of the germanium layer facilitates an improved interdiffusion between the aluminum and germanium and forms a bond.

Figure 1:
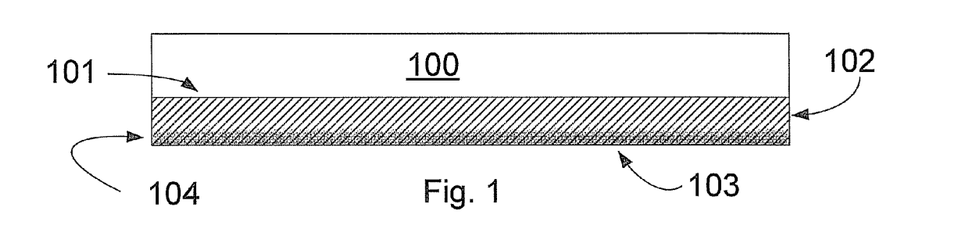
FIG. 1 schematically illustrates a wafer bearing a germanium layer according to an illustrative embodiment.

In one embodiment, a semiconductor wafer 100 with a lower face 101 has a doped germanium layer 102 on the lower face 101, as schematically illustrated in FIG. 1. The germanium layer 102 has a face 103, and an amorphous region 104 extending into the germanium layer from the face 103. The crystal structure of the germanium layer 102 has been disrupted or damaged by implantation of ions, such as argon ions for example.

The germanium layer with amorphous region in FIG. 1 covers the entire lower face 101 of wafer 100, but in some embodiments may be patterned. The depth of the amorphous germanium layer may be in the order of 1000 angstroms and can be controlled by the ion implant element size and the implant energy.

Figure 2A:
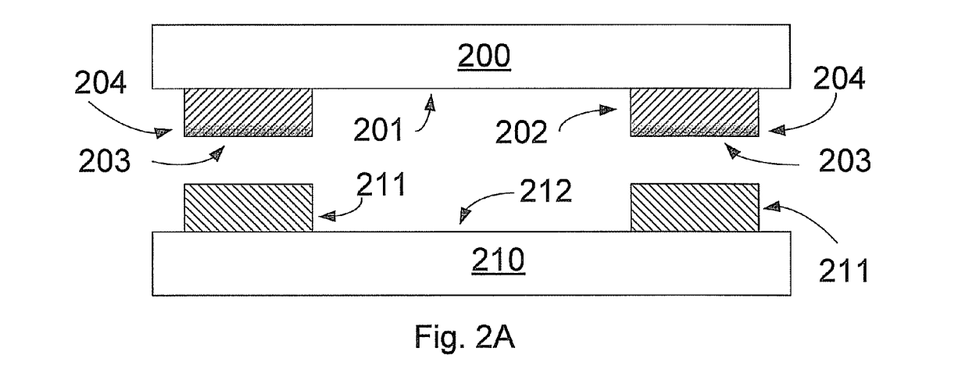
FIG. 2A schematically illustrates two wafers ready to be bonded together in accordance with one embodiment.

A cap wafer 200 and a device wafer 210 are schematically illustrated in FIG. 2A. The cap wafer 200 has a lower face 201 bearing two doped germanium regions 202. The germanium regions 202 may be independent, or may be part of a single larger structure on the lower face 201 of the wafer 200. The germanium regions 202 each have a face 203, and an amorphous region 204 extending into the germanium region from the face 203.

The device wafer 210 has two aluminum regions 211. In this embodiment, the aluminum regions 211 mirror the germanium regions 202, although other embodiments may have different configurations. For example, some embodiments may have a continuous germanium layer across the face of cap wafer 200, as in FIG. 1, rather than structures that mirror the aluminum regions 211.

Figure 2B:
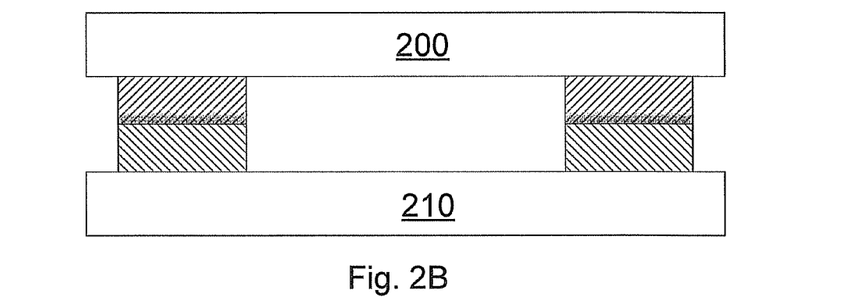
FIG. 2B schematically illustrates two wafers aligned and placed together prior to bonding in accordance with one embodiment.
Figure 2C:
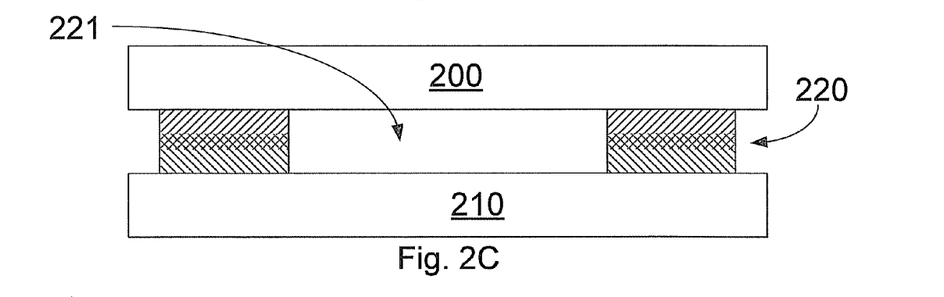
FIG. 2C schematically illustrates two wafers bonded together in accordance with one embodiment.

In FIG. 2B, the wafers 200 and 210 have been placed together so that the germanium regions 202 contact the opposing aluminum regions 211. As the wafers 200 and 210 are heated, the interface of the germanium region 202 (with its amorphous region 204) and aluminum region 211 will begin to melt, ultimately forming a eutectic bond. Such a bond 220 is schematically illustrated in FIG. 2C, in which wafers 200 and 210 have been bonded together.

In some embodiments, a gap 221 may remain between the wafers 200, 210. A circuit or MEMS device 212 may reside in, or partially within, the gap 221, so that the wafer 200 effectively forms a cap over the circuit or device. The bond 220 is hermetic, so the circuit or device is hermetically sealed within the gap 221.

Figure 3A:
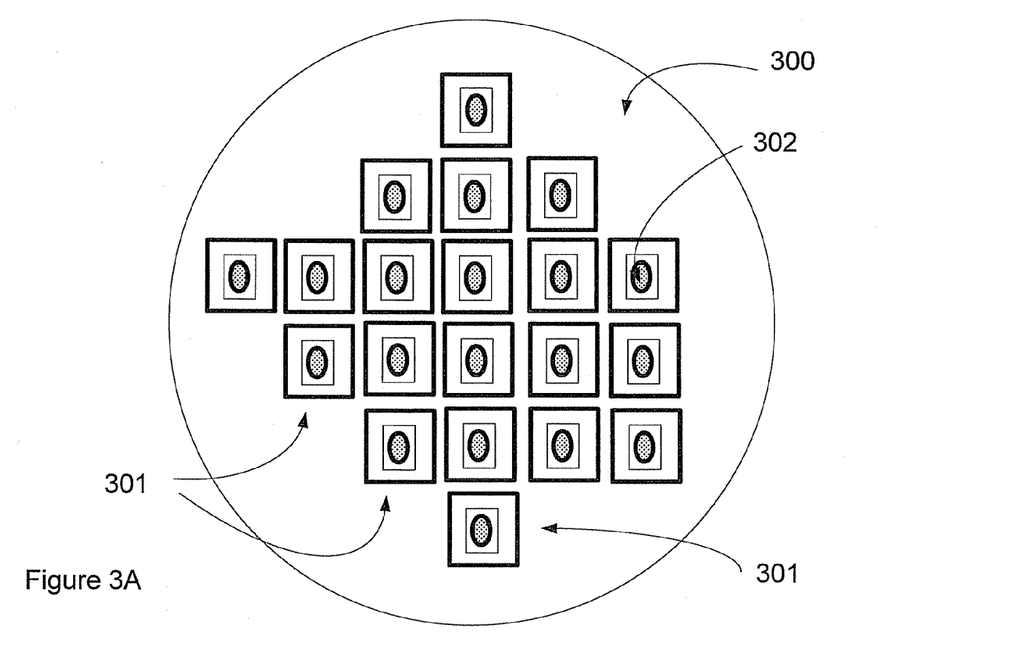
FIG. 3A schematically illustrates a wafer hosting a number of MEMS devices in accordance with one embodiment.

In some embodiments, an aluminum region 301 may be patterned on the second wafer 300, as schematically illustrated in FIG. 3A. In this figure, a number of rectangular aluminum regions 301 each surround a MEMS device 302.

Figure 3B:
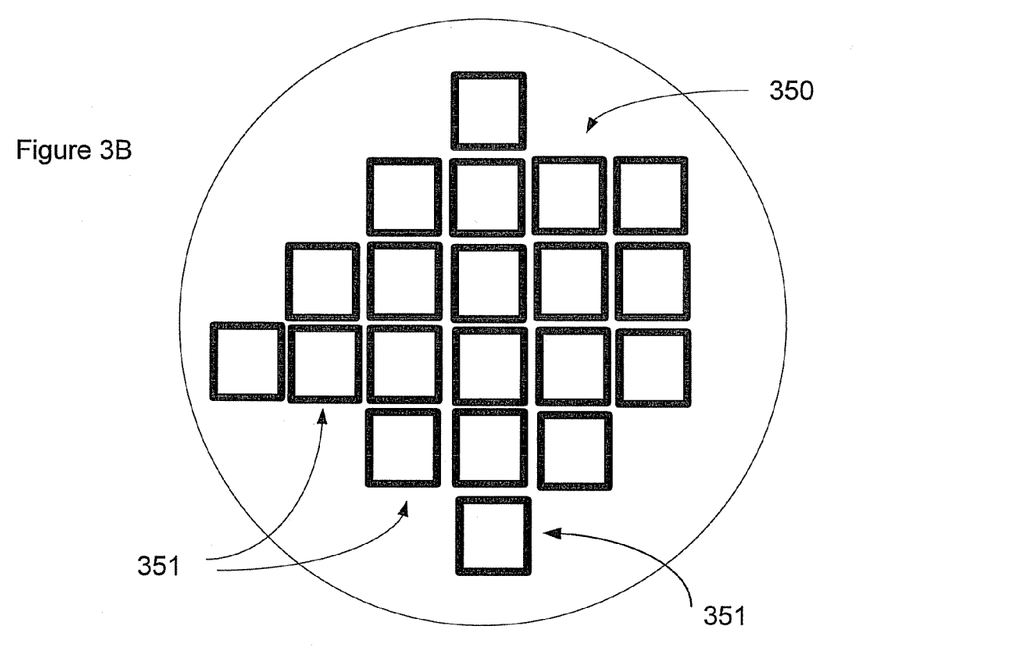
FIG. 3B schematically illustrates a cap wafer hosting a number of caps in accordance with one embodiment.

A number of opposing germanium regions 351, each with an amorphous region, may be patterned on a cap wafer 350. Each aluminum region 301 has a matching, opposing germanium region, such that the aluminum region 301 will mate precisely with its opposite germanium region 351, as illustrated in FIG. 3B. When mated together, the aluminum region 301 and the germanium region 351 will form a hermetically sealed cavity around the MEMS device 302. The bonded wafers may then be singulated, to produce a number of individually-capped, hermetically-sealed MEMS devices.

Figure 3C:
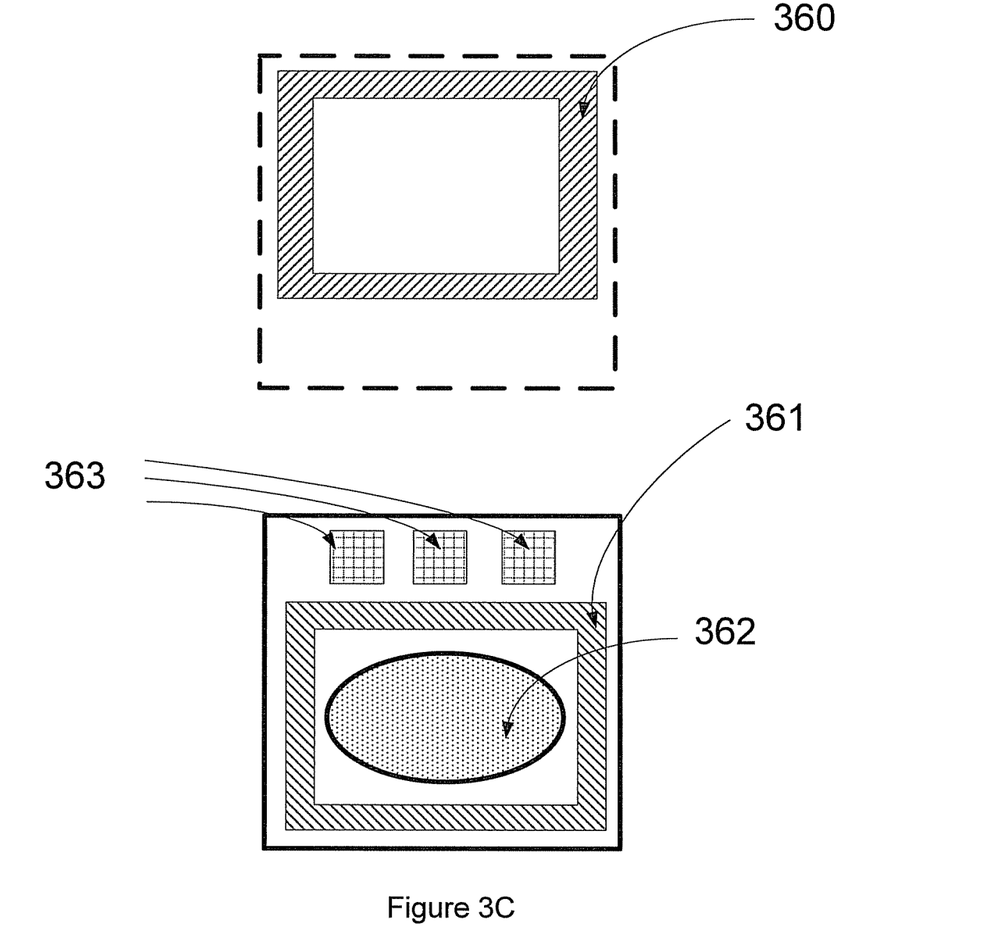
FIG. 3C schematically illustrates a MEMS device and a cap in accordance with one embodiment.

An alternative embodiment for patterned germanium and aluminum regions are schematically illustrated in FIG. 3C. Patterned aluminum region 361 on an underlying wafer forms a wall surrounding a device 362, such as a MEMS structure, infrared sensor, or integrated circuit, for example. In some embodiments, the patterned aluminum region 361 may be considered a part of the structure of the device 362. Bond pads 363, which may be made from the same aluminum layer as aluminum region 361, are adjacent to the aluminum region 361 and may provide electrical contact to the device 362. A corresponding patterned germanium layer 360 on another wafer mirrors the patterned aluminum region 361. When the two patterned regions 360 and 361 are bonded, they will form a protective, hermetically sealed wall that, along with the two wafers, forms a cavity around the device 362, as illustrated in FIG. 2C for example. At the same time, the bond pads 363 provide electrical access and connectivity to the device 362.

Figure 4:
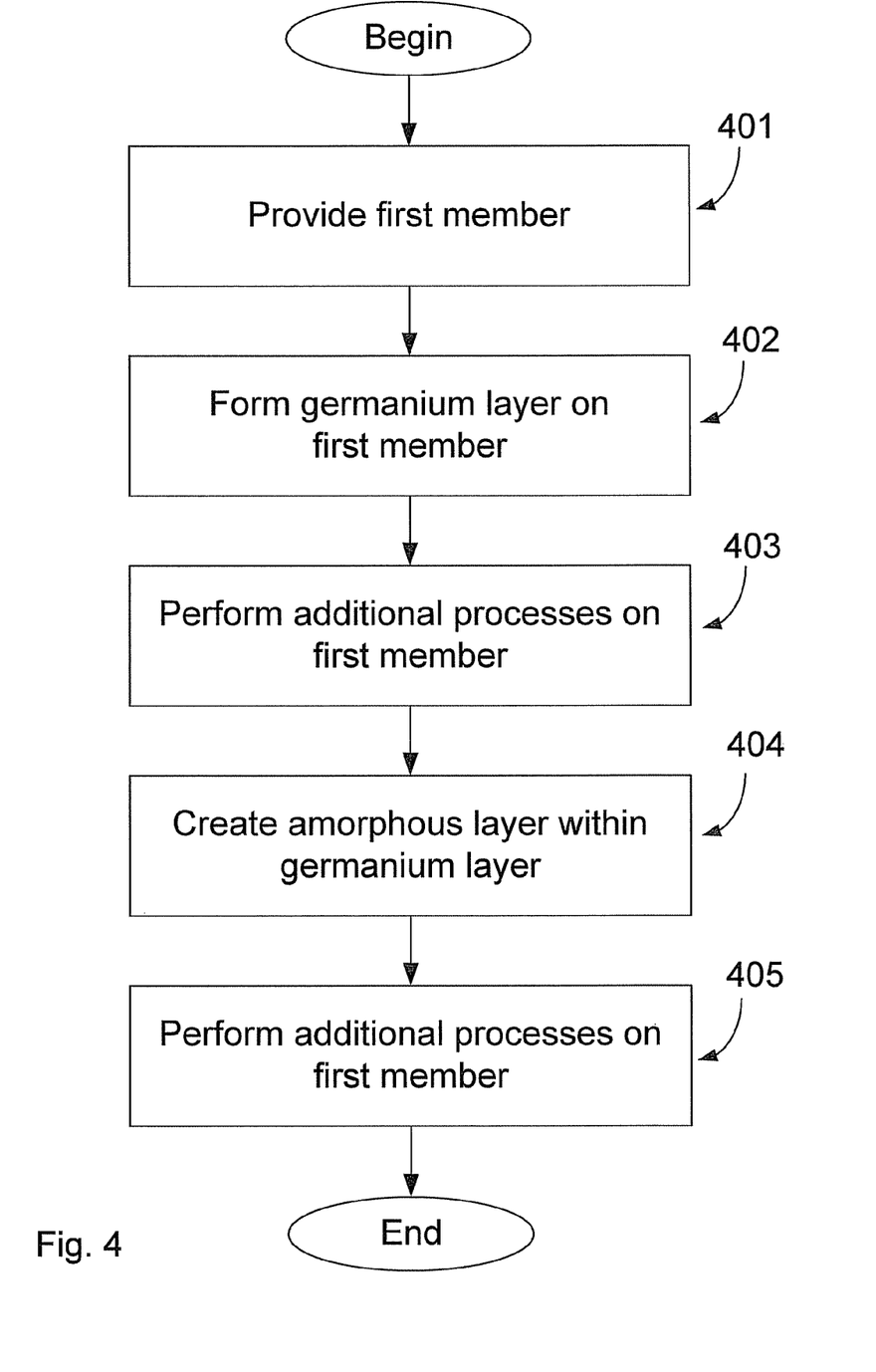
FIG. 4 is a flow chart illustrating a method of preparing a wafer bearing a germanium layer.

A method for preparing a wafer is illustrated in FIG. 4. A first member is provided (step 401), which may be a semiconductor wafer. A germanium layer is formed (step 402) on a first face of the member. The germanium layer may be an epitaxial layer, and may be deposited by a chemical vapor deposition ("CVD") process or a low pressure chemical vapor deposition ("LPCVD") process. One advantage of an epitaxial layer, as opposed to a sputtered germanium layer for example, is the ease with which it can be doped. The doping characteristics may be determined by the choice of implant, as discussed further below. Alternately, if the first member is a germanium wafer, depositing a germanium layer (step 402) may not be necessary, and may therefore be optional.

The first member may be a cap wafer for use in a wafer-capping process. Although the germanium layer may be fabricated on a MEMS wafer or integrated circuit wafer, some fabrication processes may benefit from placing the germanium layer on the cap wafer instead, since fabricating a germanium layer on a MEMS wafer or an integrated circuit wafer may be incompatible with subsequent processing steps performed on the MEMS or integrated wafer.

Some processes deposit a germanium layer on a wafer near the end of the wafer fabrication process. In contrast, in some embodiments, depositing a germanium layer on a cap wafer may be performed relatively early in the process of fabricating the wafer, thus permitting flexibility in the process and possibly creating efficiencies. For example if another part of the process uses germanium, the germanium layer may be fabricated at the same time, thus avoiding a separate process step. A germanium layer may be formed on a cap wafer prior to deep cavity etching, for example, because deep cavity etching process are incompatible with subsequent fabrication of such a germanium layer.

An amorphous region is created within the germanium layer (step 404) by, for example, ion bombardment. The presence of the amorphous region facilitates the formation of a eutectic bond with an opposing aluminum region.

One way to form the amorphous region is to use a ion implanter and implant any ion species that has sufficient size, and energy and dose to form the amorphous region with the qualities dictated by the desired process. The implant species may be selected based on the desired doping type of the germanium layer. For example, if N-type doping is desired, the ions may be argon, arsenic or antimony, while for P-type doping, the ions may be argon (inert), or a P type dopant such as boron.

The depth of the amorphous region within the germanium layer (step 404) can be controlled by the ion implantation energy. The severity of the disruption of the germanium crystal structure (which may be referred-to as the "damage" to the germanium layer) can be modulated by controlling the ion current (e.g., the disruption can be increased by increasing the ion current).

It is not necessary that the step of depositing the germanium layer be immediately followed by the creation the amorphous region. Other processing (step 403) may be performed in-between those steps, such as deep cavity etch, or any other process that would not, or the results of which would not, be adversely effected by the creation of the amorphous region. Similarly, other processing steps (405) may be performed after the formation of the amorphous layer (step 404).

Figure 5A:
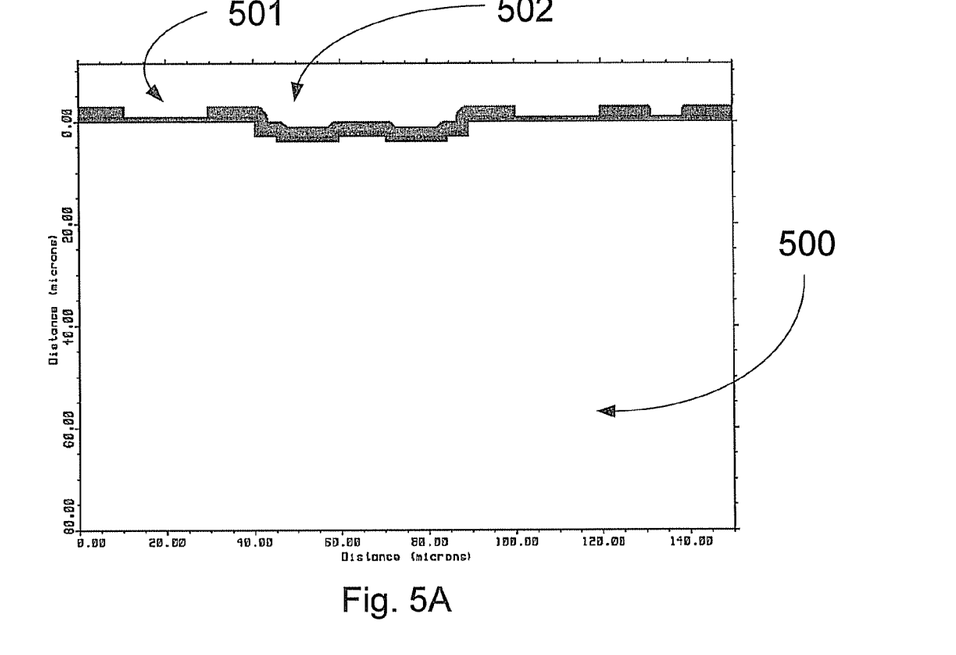
FIG. 5A schematically illustrates a germanium-clad wafer prior to trench etching.
Figure 5B:
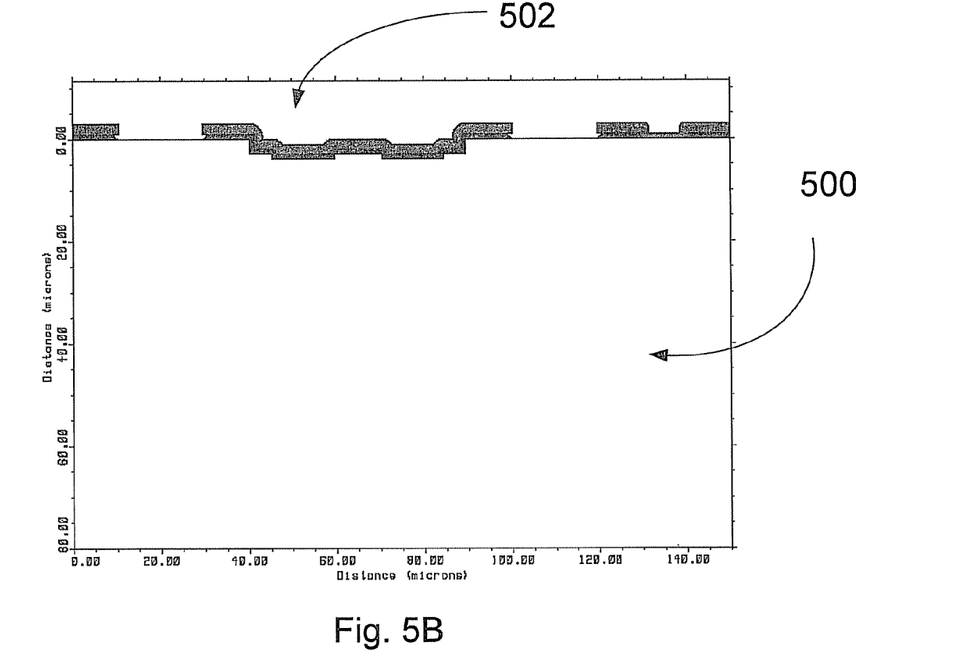
FIG. 5B schematically illustrates a germanium-clad wafer prepared for trench etching.
Figure 5C:
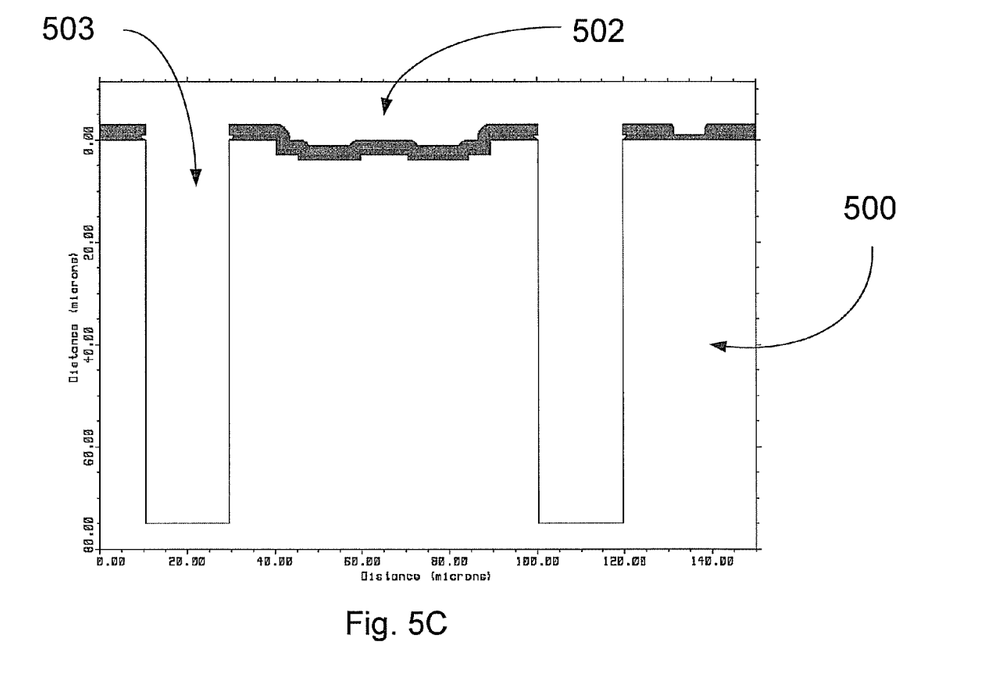
FIG. 5C schematically illustrates a germanium-clad wafer with etched trenches.

An example of additional process steps 403 and/or 405 are illustrated in FIGS. 5A-5C. In FIG. 5A, a germanium layer 501 on a wafer 500 is partially covered with, but partially exposed through, a mask 502. In FIG. 5B, the germanium layer has been removed where it was exposed, leaving the mask 502 on the wafer 500. Then, trenches 503 are etched into the wafer 500. These steps may be performed either before or after the amorphous region is formed in the germanium layer 501. Alternately, some of the steps may be performed before, and other steps may be performed after, the amorphous region is formed in the germanium layer 501.

Figure 6:
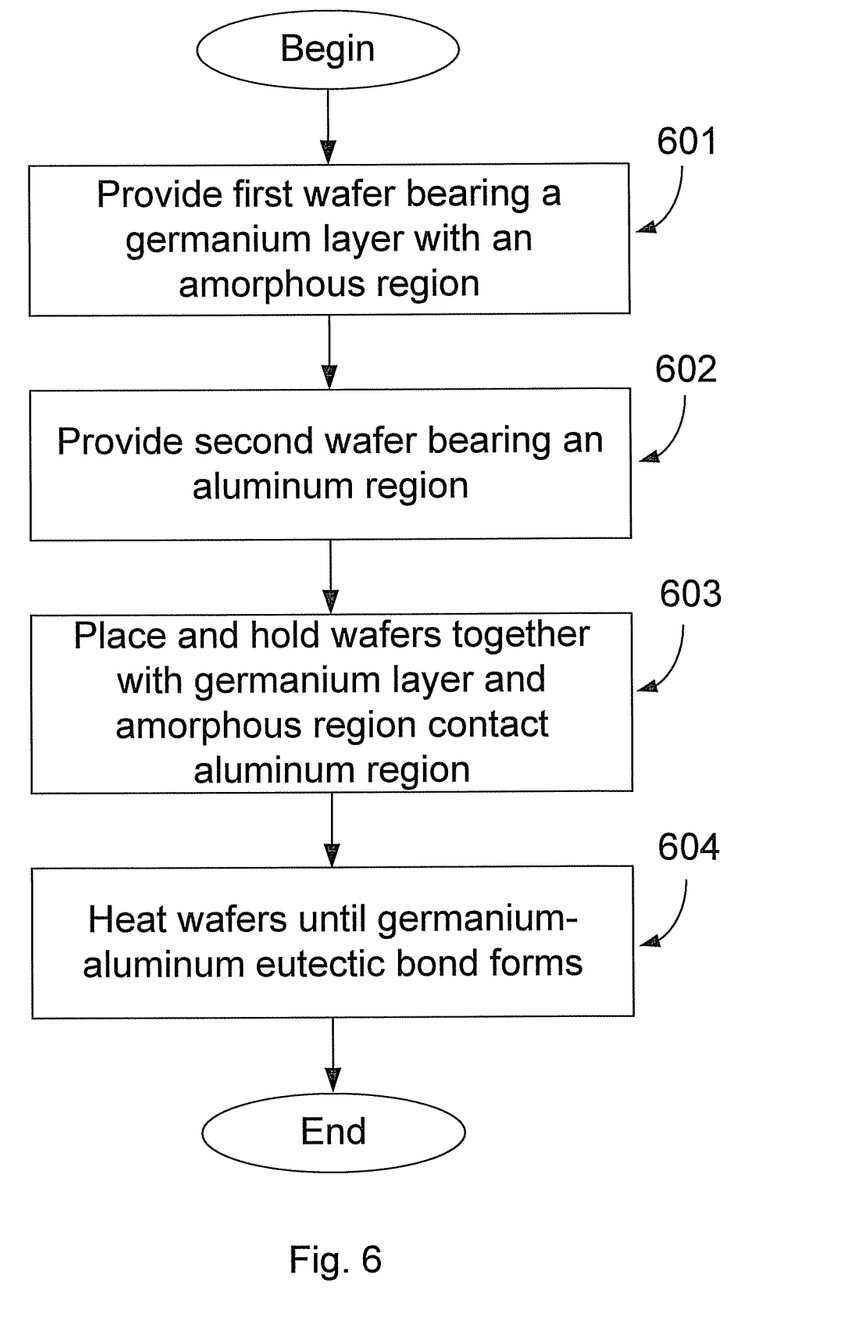
FIG. 6 is a flow chart illustrating a method of capping a MEMS wafer.

A method for bonding two wafers is illustrated in FIG. 6. A cap wafer bearing a germanium layer with an amorphous region is prepared (step 601). Such a wafer may be prepared, for example, according to the process illustrated in FIG. 4. A second wafer bearing an aluminum region is provided (step 602). The aluminum layer and/or the germanium layer may be patterned, as discussed above. The wafers are placed together such that the germanium layer is opposite to, and in contact with, the aluminum layer (step 603). Pressure may be applied to the wafers, but depending on the particular parameters of the process, might not be more than a pressure sufficient to prevent the wafers from slipping out of contact.

The wafer pair is heated (step 604) until a eutectic germanium-aluminum bond is formed at the interface of the amorphous region and the germanium layer (which may be known as the "bond interface"). The temperature may be in the range of 400 to 500 degrees Celsius, but is preferably in the region of the aluminum-germanium eutectic temperature, around 425 degrees Celsius. It is possible that the presence of the ions in the amorphous region could change the eutectic temperature of the aluminum-germanium interface. In such a case, the process temperature may be adjusted to account for any such change. In some embodiments, the wafers may be held in contact for a period of between twenty and thirty minutes to accomplish the bonding.

Prior to bonding, the alignment of the wafers may be adjusted, e.g., to make sure that corresponding features on the respective wafers are facing one other. Similarly, the alignment of the wafers may be verified after the wafers are bonded. There are many ways known in the art to align wafers or to verify their post-bonding alignment, and some involve the use of an alignment structure. For example, an infrared source may illuminate the alignment structure on an IC wafer or MEMS wafer through a cap wafer, so that the wafers may be aligned, or their alignment verified, using optical methods.

Figure 7A:
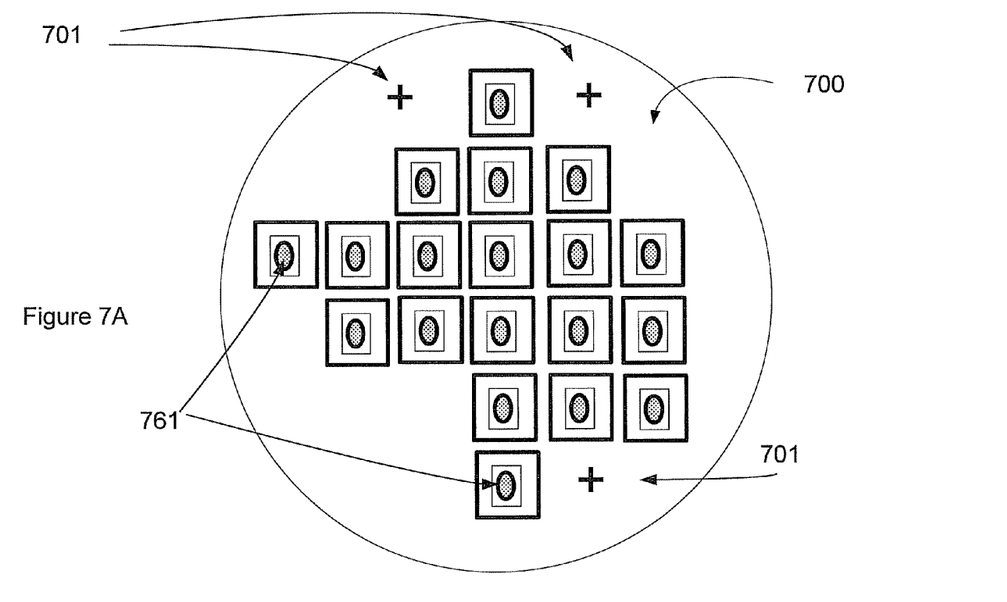
FIG. 7A schematically illustrates a device wafer with alignment structures.

Some embodiments include one or more alignment structures 701 on device wafer 700, such as an IC wafer or MEMS wafer for example, as schematically illustrated in FIG. 7A. The alignment structures 701 may be useful in aligning two wafers prior to bonding them, and/or in verifying the alignment post-bonding. If a first wafer 700 with alignment structures 701 is to be bonded to a second wafer (such as a cap wafer, for example), an infrared ("IR") source may illuminate the alignment structures on the first wafer through the second wafer. This is possible because silicon is effectively transparent to infrared radiation.

Figure 7B:
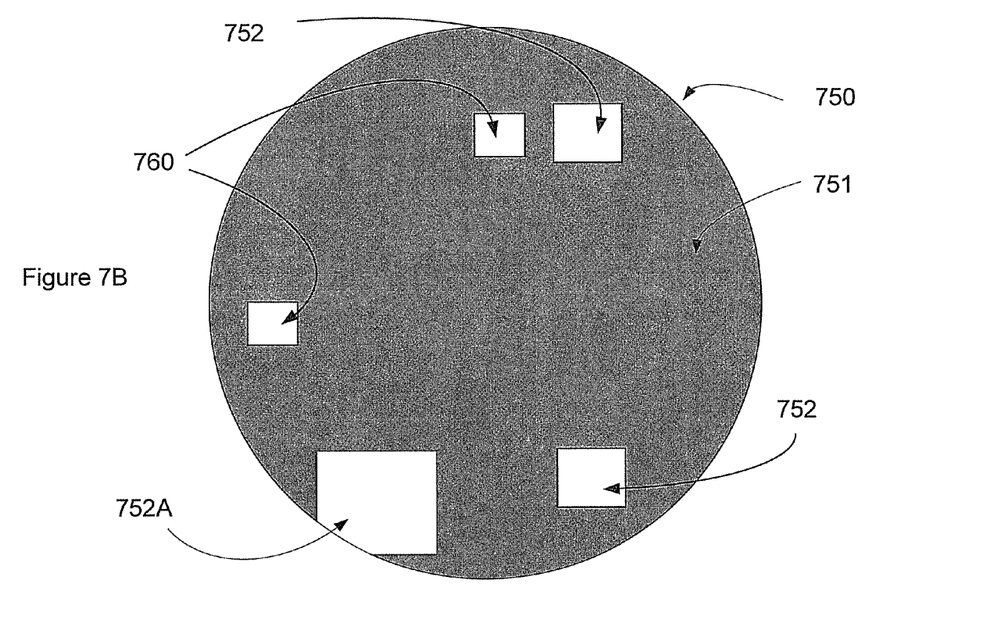
FIG. 7B schematically illustrates a germanium-clad wafer with alignment windows.

Germanium, however, is not transparent to IR sources commonly found in currently available wafer alignment tools. As such, if a wafer 700 with an alignment structure 701 is to be mated to a wafer 750 with a germanium layer 751, it may be desirable to remove a portion or portions 752 (which may be known as "windows") of the germanium layer 751 from the second wafer 750. Such a window 752 is preferably all the way through the germanium layer 751, to expose the surface of the wafer 750, and will allow infrared radiation to pass through the second wafer 750, and thereby facilitate the alignment of the wafers 700 and 750.

A window 752 may be rectangular, as illustrated, or may take a variety of other geometric shapes and properties. Several examples are presented in FIG. 7C, to illustrate but a few embodiments. In these examples, the outline of the window is shown in dashed lines, while the corresponding alignment structure as it would be seen through the window is shown in solid lines.

Figure 7C:
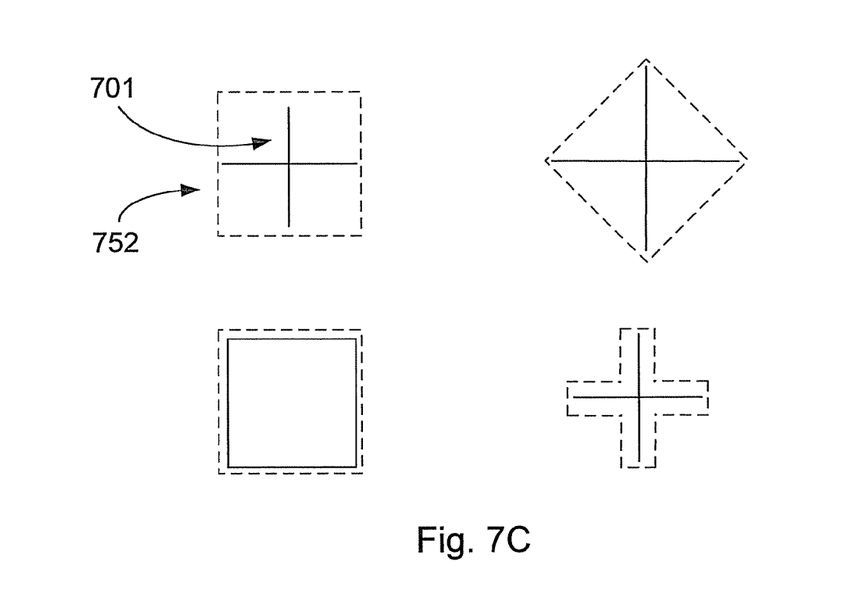
FIG. 7C schematically illustrates various embodiments of alignment structures and alignment windows.

For example, a window may have a shape that complements the alignment structure. For an alignment structure in the shape of a plus sign ("+"), a corresponding window may have a similar shape (+) so that that an IR-illuminated alignment structure fits within the window. Alternately, the window may be diamond-shaped, or circular. In some embodiments one or more windows 752A may extend all the way to an edge of a wafer 750.

Figure 7D:
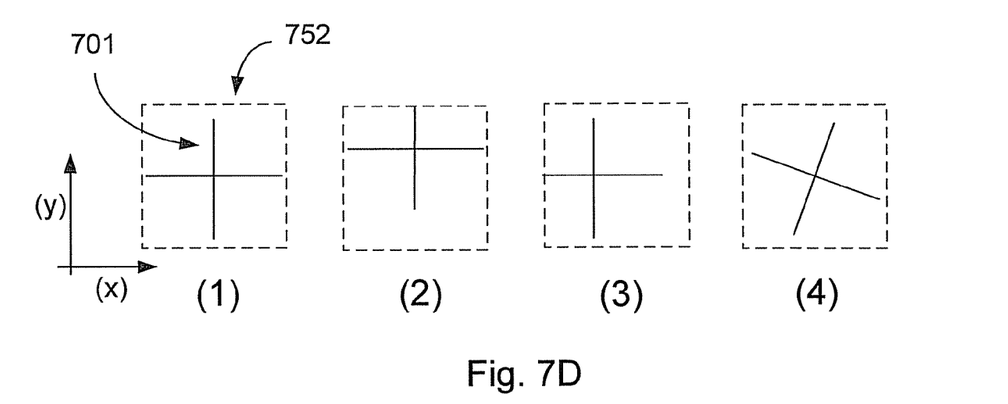
FIG. 7D schematically illustrates a view of an alignment structure and alignment window for various different alignments.

The shapes of the window and the alignment structure may interact to provide information to the user about multiple measures of alignment of two wafers, such as alignment along one or both axes within a plane of a wafer, or the relative rotations of the two wafers. For example, the first picture (1) in FIG. 7D may represent an alignment structure ("+") as it would appear through a square window when the two wafers are perfectly aligned. In contrast, the second picture (2) in FIG. 7D may represent an alignment structure ("+") as it would appear through a square window when the two wafers are misaligned in the Y-axis, while the third picture (3) represents a misalignment in the X-axis. The fourth picture (4) may represent an alignment structure ("+") as it would appear through a square window when the two wafers are rotated with respect to one another.

Rather than require that the device wafer have a dedicated alignment structure (e.g., structure 701 on wafer 700), an alignment window could also be placed to expose another structure on a device wafer. For example, if a device wafer has a MEMS structure 761, as illustrated in FIG. 7A, an alignment window 760 could be placed to expose that structure 761. The window is large enough to expose the structure 761, yet sized so that it does not expose any structure to which the germanium is to be bonded. This approach will allow, for example, a post-bond alignment check by IR microscopy without interfering with the bonding qualities of the germanium layer and without requiring a dedicated alignment structure 701 (and the fabrication process and space that it would require) on the device wafer 700. Such an alignment window 760 could be placed anywhere on the wafer 750 where it would expose a corresponding structure 761 on a device wafer 700. In FIG. 7B, two windows 760 are illustrated, both near the outer periphery of the wafer 750 to expose MEMS structures 761 on device wafer 700

The process of removing part of a germanium layer 751 to create one or more windows may be an additional process step (e.g., steps 403 and/or 405) as discussed in connection with FIG. 4.

Various features described herein may be mixed and matched in combinations not specifically described or illustrated. As just one example, a patterned aluminum region 361 used in conjunction with bond pads 363 as illustrated in FIG. 3C may also be used with a blanket germanium region as described and illustrated in FIG. 1, and with or without windows as illustrated and described in connection with FIGS. 7A and 7B.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of capping a wafer, the method comprising:
providing a first wafer having a first face, the first face bearing an aluminum bonding layer;
providing a cap wafer having a second face, the second face bearing an epitaxial germanium layer, the epitaxial germanium layer comprising an amorphous region in which the crystal structure of the germanium is disrupted by implanted ions;
aligning the aluminum layer to the amorphous region;
holding the aligned wafers together, at temperature in the range of about 400 degrees to about 500 degrees Celsius until an aluminum-germanium bond is formed at the interface of the aluminum layer and the amorphous region.

2. A method according to claim 1, wherein the ions comprise antimony ions.

3. A method according to claim 1, wherein the ions comprise arsenic ions.

4. A method according to claim 1, wherein the ions comprise argon ions.

5. A method according to claim 1 further comprising fabricating an alignment window through the germanium layer by removing a portions of the germanium layer to expose the second face.

6. A method according to claim 1, wherein the first wafer includes an alignment target structure, and wherein the method further comprises performing a post-bonding alignment check by illuminating the target structure through the alignment window using infrared radiation.

7. A method according to claim 6 wherein the shape of the alignment structure and the shape of the alignment window interact to provide information about the orientation of the wafers in at least two dimensions in a plane of the first wafer, as well as information relating to the rotation of the second wafer with respect to the first wafer within the plane of the first wafer.

8. A method according to claim 1 wherein providing a first wafer having a first face, the first face bearing an aluminum bonding layer comprises providing an aluminum layer comprising a plurality of substantially identical aluminum walls, each wall surrounding an area on the first wafer.

9. A method according to claim 8 further comprising forming individual cap structures on the cap wafer by patterning the germanium layer to form a plurality of substantially identical germanium regions corresponding to the plurality of substantially identical aluminum walls.

10. A method according to claim 1 wherein the temperature is 424-426 degrees Celsius.

11. A method according to claim 1, wherein providing a cap wafer with an epitaxial germanium layer comprises implanting ions into the germanium layer with an ion implanter.

12. A method according to claim 1, further comprising etching through the germanium layer and into the substrate to form a trench that exposes the interior or the substrate.

13. A wafer configured to bond to a second wafer, the wafer having a first surface, the wafer comprising:
a germanium layer on the first surface, the germanium layer further comprising:
a second surface parallel to, and facing away from, the first surface; and
an amorphous region comprising ions, the amorphous region extending into the germanium layer from the second surface, wherein the amorphous region is configured to be exposed to the second wafer.

14. A wafer according to claim 13, wherein the ions comprise one of antimony ions, arsenic ions, and argon ions.

15. A wafer according to claim 13, wherein the wafer is a cap wafer, and the germanium layer comprises individual germanium cap structures.

16. A wafer according to claim 15, wherein the wafer further comprises trenches between individual cap structures.

17. A wafer according to claim 13, wherein the wafer is a cap wafer, and further comprises an alignment window within the germanium layer.

18. A capped die comprising:
a die having a first face, and an aluminum layer on the first face;
a cap having a crystalline orientation, and a second face;
a germanium layer on the second face; wherein the germanium layer is parallel to the second face, and wherein the crystalline orientation of the germanium layer matches the crystalline orientation of the second face;
an amorphous region within the germanium layer, the amorphous region comprising ions and extending into the germanium layer from the second face; and
a bond region comprising a eutectic bond between the aluminum layer and germanium layer.

19. A capped die according to claim 18, wherein the bonding layer forms a hermetic seal between the die and the cap.

20. A capped die according to claim 19 further comprising a MEMS device between the die and cap and within the hermetic seal.

* * * * *